United States Patent
Fujiwara

(10) Patent No.: US 11,824,512 B2
(45) Date of Patent: Nov. 21, 2023

(54) PIEZOELECTRIC RESONATOR DEVICE

(71) Applicant: Daishinku Corporation, Kakogawa (JP)

(72) Inventor: Hiroki Fujiwara, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 765 days.

(21) Appl. No.: 16/970,629

(22) PCT Filed: Mar. 4, 2019

(86) PCT No.: PCT/JP2019/008343
§ 371 (c)(1),
(2) Date: Aug. 18, 2020

(87) PCT Pub. No.: WO2019/176616
PCT Pub. Date: Sep. 19, 2019

(65) Prior Publication Data
US 2020/0382096 A1   Dec. 3, 2020

(30) Foreign Application Priority Data

Mar. 13, 2018 (JP) .................. 2018-045858
Mar. 13, 2018 (JP) .................. 2018-045859

(51) Int. Cl.
*H03H 9/02* (2006.01)
*H03H 9/05* (2006.01)
(Continued)

(52) U.S. Cl.
CPC .... *H03H 9/02133* (2013.01); *H03H 9/02102* (2013.01); *H03H 9/0523* (2013.01);
(Continued)

(58) Field of Classification Search
CPC .... H03H 9/2133; H03H 9/02102; H03H 9/19; H03H 9/1035; H03H 9/0547; H03H 9/0523
See application file for complete search history.

(56) References Cited

U.S. PATENT DOCUMENTS 9,000,304 B2 * 4/2015 Kohda .................. B81B 7/007
310/311
9,929,716 B2 * 3/2018 Lee .......................... H03H 3/02
(Continued)

FOREIGN PATENT DOCUMENTS

JP        2010-252051 A    11/2010

*Primary Examiner* — J. San Martin
(74) *Attorney, Agent, or Firm* — METROLEX IP LAW GROUP, PLLC

(57) ABSTRACT

A through hole formed in an AT-cut crystal plate includes an inclined surface (72) that extends from a peripheral area toward a penetrating part (71) in a center part of the through hole. The inclined surface (72) includes: a first crystal surface S1 that extends from the penetrating part (71) toward the peripheral area of the through hole in a −Z' and a +X directions; a second crystal surface S2 that extends from the penetrating part (71) toward the peripheral area of the through hole in the −Z' and the +X directions and that contacts with the first crystal surface S1 in the +Z' and the +X directions of the first crystal surface S1; and a third crystal surface S3 that contacts with the second crystal surface S2 in the +X direction of the second crystal surface S2 and that contacts with the main surface of the AT-cut crystal plate. A compensation surface Sc is formed between the main surface of the AT-cut crystal plate and the three crystal surfaces Si to S3 to prevent first and second ridge lines L1 and L2 from reaching the main surface of the AT-cut crystal plate.

4 Claims, 16 Drawing Sheets

(51) Int. Cl.
*H03H 9/10* (2006.01)
*H03H 9/19* (2006.01)

(52) U.S. Cl.
CPC ........ *H03H 9/0547* (2013.01); *H03H 9/1035* (2013.01); *H03H 9/19* (2013.01)

(56) References Cited

U.S. PATENT DOCUMENTS

2010/0270891 A1* 10/2010 Kohda ................. H03H 9/1035
  29/25.35
2018/0241370 A1* 8/2018 Sekiya .................... H01L 24/13
2022/0077841 A1* 3/2022 Ishino ..................... H01L 25/07

* cited by examiner (a)

(b)

(a)

(b)

(a)

(b)

(a)

(b)

(a)

(b)

PIEZOELECTRIC RESONATOR DEVICE

TECHNICAL FIELD

The present invention relates to a piezoelectric resonator device.

BACKGROUND ART

Recently, in various electronic devices, the operating frequencies have increased and the package sizes (especially, the heights) have been decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to Be Solved by the Invention

Nowadays, there is a demand of further reduction in the area of the piezoelectric resonator device having the sandwich structure. However, in the piezoelectric resonator device having the sandwich structure, in the case where the first sealing member is made of an AT-cut crystal plate and furthermore the area of the device is reduced, the inventor of the present invention found the problem that a through hole formed in the first sealing member is likely to be cracked.

Here, FIG. 15 is a cross-sectional view illustrating a schematic configuration of a piezoelectric resonator device 500 having the sandwich structure. The piezoelectric resonator device 500 includes: a crystal resonator plate 510; a first sealing member 520 and a second sealing member 530. A substantially rectangular parallelepiped package is configured by bonding the crystal resonator plate 510 to the first sealing member 520, and also by bonding the crystal resonator plate 510 to the second sealing member 530.

The crystal resonator plate 510 includes: a vibrating part 511 on both surfaces of which a pair of excitation electrodes (not shown) is formed; an external frame part 512 that surrounds an outer periphery of the vibrating part 511; and a support part 513 that connects the vibrating part 511 to the external frame part 512 and thus supports the vibrating part 511. That is, the crystal resonator plate 510 has a configuration in which the vibrating part 511, the external frame part 512 and the support part 513 are integrally provided.

Also, in the down-sized piezoelectric resonator device 500, conduction between electrodes/pieces of wiring is obtained, generally, by through holes 550. When the through holes 550 are provided in the first sealing member 520, they are formed in a region that superimposes on the external frame part 512 of the crystal resonator plate 510.

When handling the piezoelectric resonator device 500, or when mounting an IC chip on the piezoelectric resonator device 500, an external force F1 may be applied, from the above, to the center part of the first sealing member 520 (i.e. the point of effort P1), as shown in FIG. 16(a). In this case, according to the principle of leverage, an inner peripheral part of the external frame part 512 of the crystal resonator plate 510 serves as the fulcrum P2 while an inner peripheral part of the through hole 550 serves as the point of load P3 where a stress F3 is generated.

When the area of the piezoelectric resonator device 500 is further reduced, the width of the external frame part 512 is also reduced, as shown in FIG. 16(b). In such a piezoelectric resonator device 500 having the width-reduced external frame part 512, the stress F3 that is generated in the through hole 550 by the principle of leverage may be considerably larger than the stress F3 in FIG. 16(a), because the reduction in the width of the external frame part 512 causes a consequence that the distance between the fulcrum P2 and the point of load P3 becomes further smaller relative to the distance between the point of effort P1 and the fulcrum P2.

Thus, as the area of the piezoelectric resonator device is reduced (i.e. the width of the external frame part of the crystal resonator plate is reduced), the stress generated at the edge part of the through hole is increased, which is likely to generate a crack in the through hole.

The present invention was made in consideration of the above problem, an object of which is to provide a sandwich-structured piezoelectric resonator device capable of reducing stress concentration in the through hole and thus preventing generation of cracks.

Means for Solving the Problem

In order to solve the above problem, a piezoelectric resonator device according to a first embodiment of the present invention includes: a piezoelectric resonator plate; a first sealing member covering a first main surface of the piezoelectric resonator plate; a second sealing member covering a second main surface of the piezoelectric resonator plate; and an internal space formed by bonding the first sealing member to the piezoelectric resonator plate and by bonding the second sealing member to the piezoelectric resonator plate. The internal space hermetically seals a vibrating part including a first excitation electrode and a second excitation electrode of the piezoelectric resonator plate. The piezoelectric resonator plate includes: the vibrating part; a support part that supports the vibrating part; and an external frame part that surrounds an outer periphery of the vibrating part and that supports the support part. The first sealing member is made of an AT-cut crystal plate, and includes a through hole that is provided in a +Z' direction relative to an inner peripheral edge of the external frame part of the piezoelectric resonator plate. The through hole includes an inclined surface in a main surface, which is opposite to a surface bonded to the piezoelectric resonator plate, of the first sealing member. The inclined surface extends from a peripheral area of the through hole toward a penetrating part in a center part of the through hole. The inclined surface includes: a first crystal surface that extends from the penetrating part toward the peripheral area of the through hole in a −Z' direction and in a +X direction; a second crystal surface that extends from the penetrating part toward the peripheral area of the through hole in the −Z' direction and in the +X direction and that comes into contact with the first crystal surface in the +Z' direction and in the +X direction of the first crystal surface; and a third crystal surface that comes into contact with the second crystal surface in the +X direction of the second crystal surface and that comes into contact with the main surface of the first sealing member. A compensation surface is formed between the main surface of the first sealing member and the three crystal surfaces so as to prevent a ridge line between the first crystal surface and the second crystal surface and also a ridge line between the second crystal surface and the third crystal surface from reaching the main surface of the first sealing member.

With the above-described configuration of the piezoelectric resonator device having the sandwich structure, it is possible to reduce stress concentration in the through hole and thus to prevent generation of cracks. That is, in the conventional through hole, two ridge lines generated on an inner wall surface of the through hole reach the main surface of the AT-cut crystal plate and furthermore intersect with each other on the outer periphery of the through hole, thus a stress concentration point is generated, which serves as a starting point to generate a crack. In contrast, in the through hole of the above-described configuration, a compensation surface is formed on the area where the stress concentration occurs. Therefore, the two ridge lines do not intersect with each other on the outer peripheral edge of the through hole. Consequently, it is possible to prevent generation of the stress concentration point, which also prevents generation of a crack from the stress concentration point as the starting point.

Also, in the above-described piezoelectric resonator device, the compensation surface may come into contact with only the three crystal surfaces in the inclined surface while not coming into contact with any other crystal surfaces.

With the above-described configuration, it is possible to form only minimum necessary compensation surfaces, which avoids other unnecessary crystal surfaces being formed in the through hole. In the case where unnecessary crystal surfaces are increased in the through hole, conduction resistance may also be increased. However, in this configuration, since the unnecessary crystal surfaces are not formed, it is possible to prevent increase in the conduction resistance.

Also, in the above-described piezoelectric resonator device, in a boundary line between the compensation surface and the main surface of the first sealing member, a distance between both endpoints of the boundary line may be in a range from not less than 5% to not more than 30% of a maximum diameter of the through hole.

With the above-described configuration, it is possible to form the compensation surface with an appropriate size in the through hole. When the value of the above distance between both endpoints is not more than 5% of the maximum diameter of the through hole, the compensation surface is too small to obtain a sufficient effect to reduce the stress concentration. On the other hand, when the value of the above distance is not less than 30%, unnecessary crystal surfaces are increased due to a too large compensation surface, which may lead to increase in conduction resistance.

Also in order to solve the above problem, a piezoelectric resonator device according to a second embodiment of the present invention includes: a piezoelectric resonator plate; a first sealing member covering a first main surface of the piezoelectric resonator plate; a second sealing member covering a second main surface of the piezoelectric resonator plate; and an internal space formed by bonding the first sealing member to the piezoelectric resonator plate and by bonding the second sealing member to the piezoelectric resonator plate. The internal space hermetically seals a vibrating part including a first excitation electrode and a second excitation electrode of the piezoelectric resonator plate. The piezoelectric resonator plate includes: the vibrating part; a support part that supports the vibrating part; and an external frame part that surrounds an outer periphery of the vibrating part and that supports the support part. The first sealing member is made of an AT-cut crystal plate, and includes a through hole that is provided in a +Z' direction relative to an inner peripheral edge of the external frame part of the piezoelectric resonator plate. The through hole includes an inclined surface in a main surface, which is opposite to a surface bonded to the piezoelectric resonator plate, of the first sealing member. The inclined surface extends from a peripheral area of the through hole toward a penetrating part in a center part of the through hole. In ridge lines between crystal surfaces that exist in the inclined surface, no ridge line intersects with any other ridge line on an outer periphery of the through hole.

With the above-described configuration of the through hole that is formed in the piezoelectric resonator device having the sandwich structure, no ridge line between the crystal surfaces intersects with any other ridge line on the outer periphery of the through hole. Consequently, it is possible to prevent generation of the stress concentration point, which also prevents generation of a crack from the stress concentration point as the starting point.

Effect of the Invention

The piezoelectric resonator device of the present invention provides advantageous effects of preventing generation of a stress concentration point in a through hole and thus preventing generation of a crack from the stress concentration point as a starting point.

BRIEF DESCRIPTION OF THE DRAWINGS

FIG. 1 is a schematic configuration diagram schematically illustrating a configuration of a crystal oscillator according to an embodiment of the present invention.

FIG. 2 is a schematic plan view illustrating a first main surface of a first sealing member of the crystal oscillator.

FIG. 3 is a schematic plan view illustrating a second main surface of the first sealing member of the crystal oscillator.

FIG. 4 is a schematic plan view illustrating a first main surface of a crystal resonator plate of the crystal oscillator.

FIG. 5 is a schematic plan view illustrating a second main surface of the crystal resonator plate of the crystal oscillator.

FIG. 6 is a schematic plan view illustrating a first main surface of a second sealing member of the crystal oscillator.

FIG. 7 is a schematic plan view illustrating a second main surface of the second sealing member of the crystal oscillator.

FIG. 8 are diagrams illustrating a shape of a through hole formed in an AT-cut crystal plate by etching using a circular mask. FIG. 8(a) is a cross-sectional view thereof while FIG. 8(b) is a plan view thereof.

FIG. 9 are diagrams illustrating a shape of a through hole according to Embodiment 1. FIG. 9(a) is an enlarged plan view illustrating the vicinity of a compensation surface formed in the through hole while FIG. 9(b) is an enlarged perspective view illustrating the vicinity of the compensation surface formed in the through hole, viewed from diagonally above.

FIG. 10 is a plan view illustrating a shape of a mask that is used for forming the through hole of FIG. 9.

FIG. 11 is a diagram explaining a desirable size of the compensation surface in the through hole of FIG. 9.

FIG. 12(a) is a plan view illustrating a through hole according to Embodiment 2. FIG. 12(b) is a cross-sectional view taken from line A-A of FIG. 12(a).

FIG. 13 are cross-sectional views illustrating processes of forming the through hole of FIG. 12. FIG. 13(a) illustrates a state in which a first etching step has been completed.

FIG. 13(b) illustrates a state in which a second etching step has been completed.

FIGS. 14(a) and 14(b) are plan views illustrating each shape of masks that are used for forming the through hole of FIG. 12.

FIG. 15 is a cross-sectional view illustrating a schematic configuration of a piezoelectric resonator device having a sandwich structure.

FIG. 16 are diagrams illustrating a principle of generation of stress in a through hole in a piezoelectric resonator device having a sandwich structure. FIG. 16(a) illustrates a piezoelectric resonator device having a normal size while FIG. 16(b) illustrates a size-reduced piezoelectric resonator device.

MEANS FOR CARRYING OUT THE INVENTION

Embodiment 1

Hereinafter, Embodiment 1 of the present invention will be described in detail with reference to the drawings. In Embodiment 1 below, the present invention is applied to a crystal oscillator as a piezoelectric resonator device.

Crystal Oscillator

Figure 1:
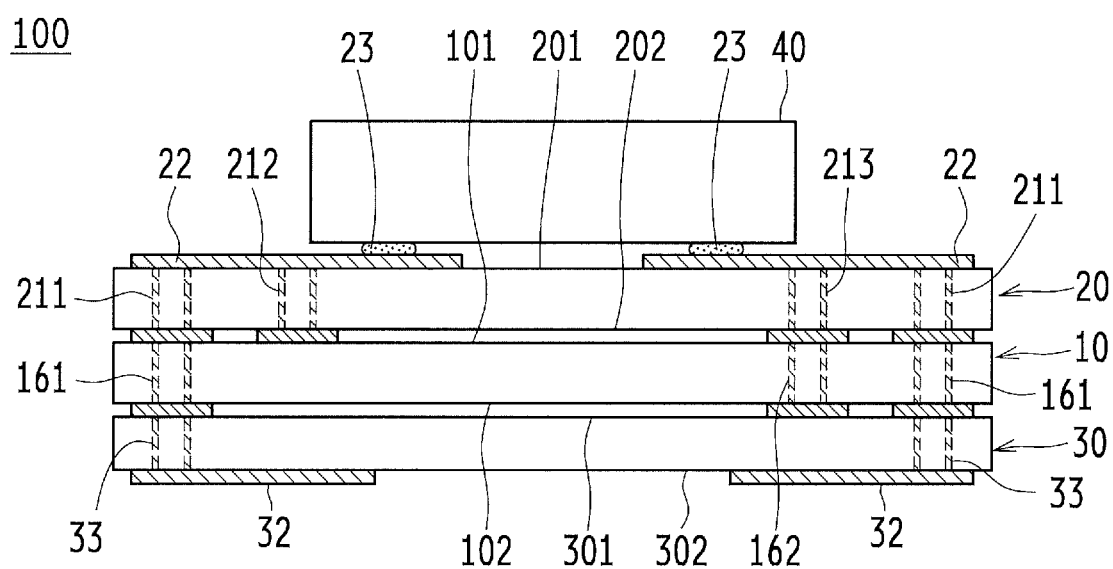
[FIG. 1]

First, the basic configuration of a crystal oscillator 100 according to Embodiment 1 is described. As shown in FIG. 1, the crystal oscillator 100 includes: a crystal resonator plate (piezoelectric resonator plate) 10; a first sealing member 20; a second sealing member 30; and an IC chip 40. In the crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. That is, in the crystal oscillator 100, the first sealing member 20 and the second sealing member 30 are bonded respectively to both main surfaces of the crystal resonator plate 10, thus an internal space of the package is formed. In this internal space, a vibrating part 11 (see FIGS. 4 and 5) is hermetically sealed.

Also, the IC chip 40 is mounted on a main surface, which is opposite to a surface bonded to the crystal resonator plate 10, of the first sealing member 20. The IC chip 40 as an electronic component element is a one-chip integrated circuit element constituting, with the crystal resonator plate 10, an oscillation circuit.

The crystal oscillator 100 according to Embodiment 1 has, for example, a package size of 1.0×0.8 mm, which is reduced in size and height. According to the size reduction, no castellation is formed in the package. Through holes (described later) are used for conduction between electrodes.

Next, the respective components of the above-described crystal oscillator 100 (i.e. the crystal resonator plate 10, the first sealing member 20 and the second sealing member 30) are described with reference to FIGS. 1 to 7. Here, each of the components is described as a single body without being bonded. FIGS. 2 to 7 are merely show respective examples of the crystal resonator plate 10, the first sealing member 20 and the second sealing member 30, and thus the present invention is not limited thereto.

Figure 4:
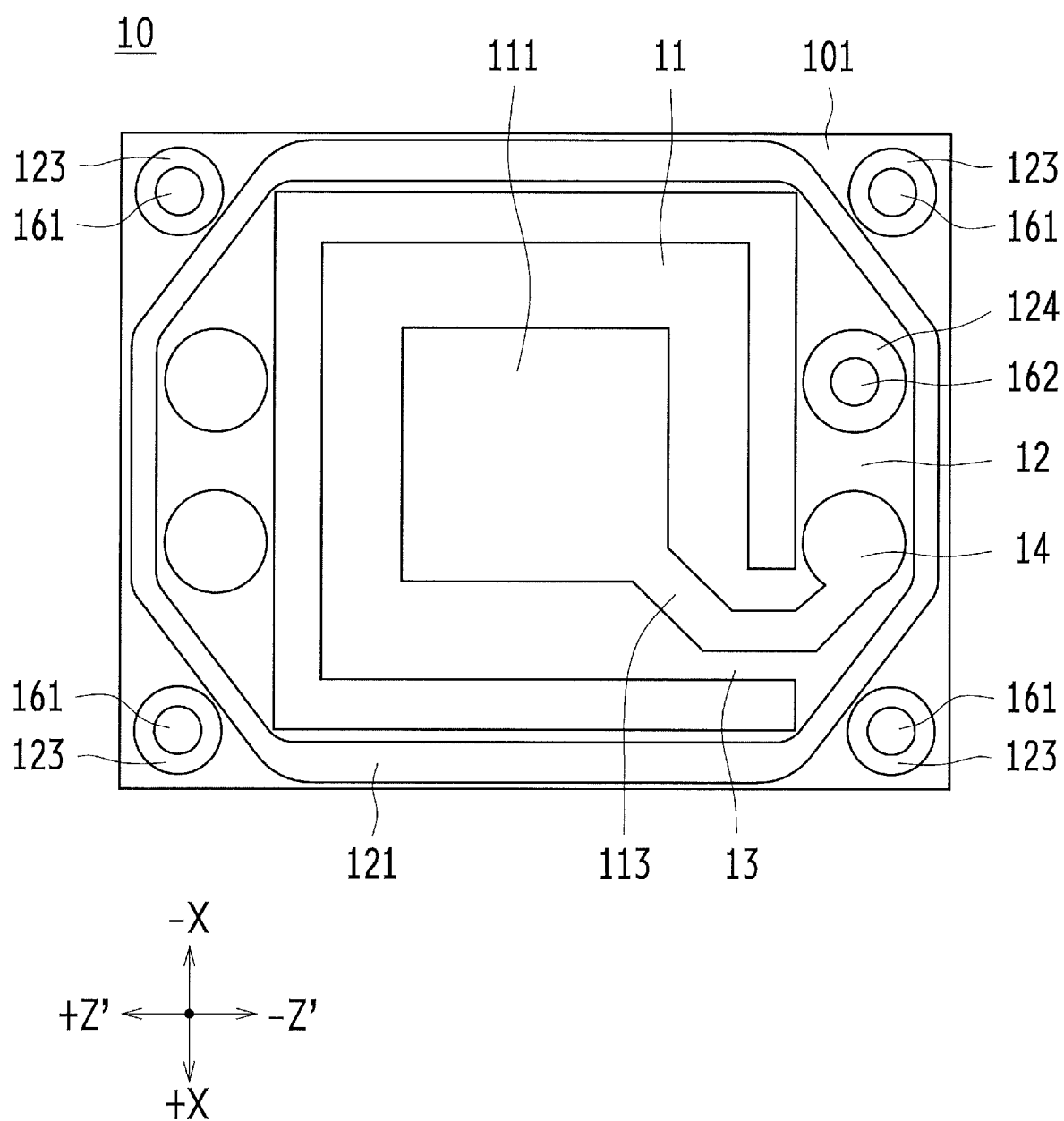
[FIG. 4]
Figure 5:
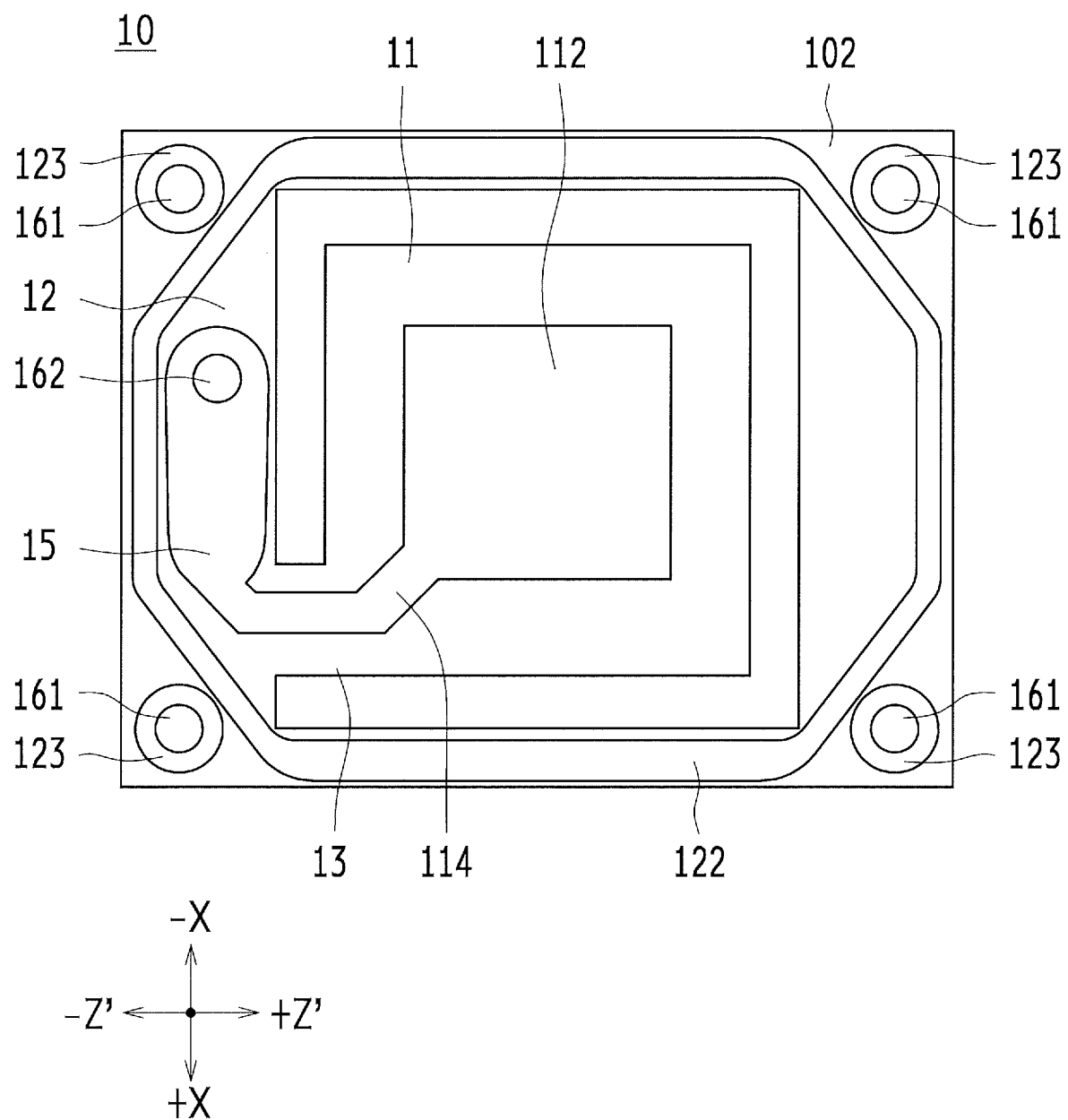
[FIG. 5]

The crystal resonator plate 10 is a piezoelectric substrate made of crystal as shown in FIGS. 4 and 5. Both main surfaces (i.e. a first main surface 101 and a second main surface 102) are formed as smooth flat surfaces (mirror-finished). In Embodiment 1, an AT-cut crystal plate that causes thickness shear vibration is used as the crystal resonator plate 10. In the crystal resonator plate 10 shown in FIGS. 4 and 5, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by approximately 35° 15' from the Y axis and the Z axis out of the crystal axes of the crystal (this cutting angle may be changed to a certain extent within the range in which the frequency temperature characteristics of the AT-cut crystal resonator plate can be adjusted). The Y' axis direction and the Z' axis direction correspond to the directions in which the AT-cut crystal is cut out.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to pieces of lead-out wiring (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 4 and 5, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 4 and 5, on the side in the +Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective central parts of the first through holes 161 and the second through hole 162 are hollow penetrating parts penetrating between the first main surface 101 and the second main surface 102.

Figure 2:
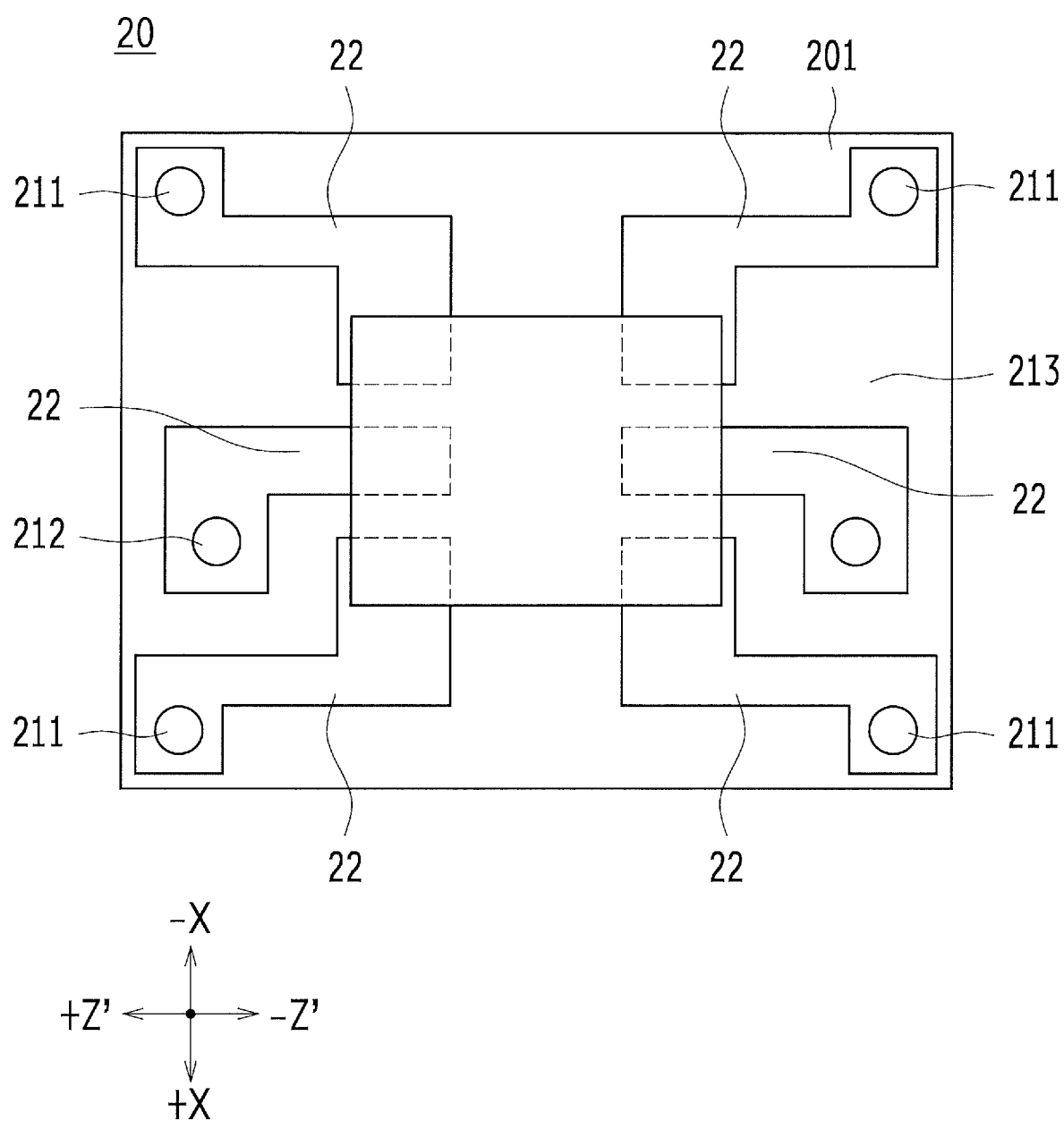
[FIG. 2]
Figure 3:
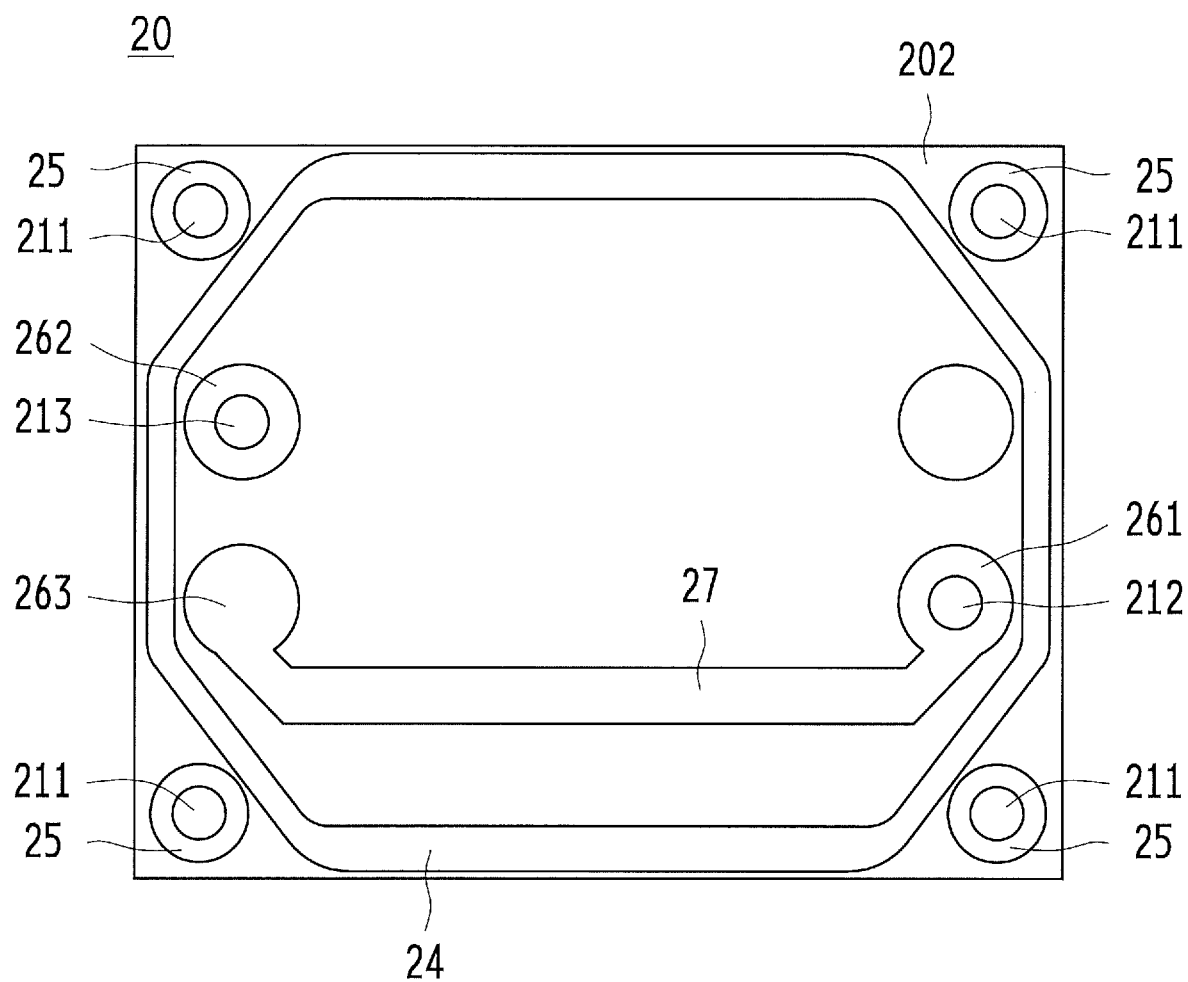
[FIG. 3]
Figure 3:
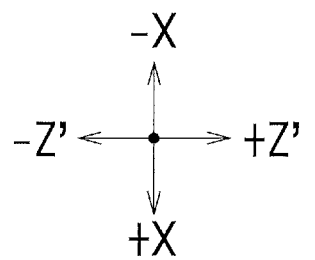

As shown in FIGS. 2 and 3, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 2, on a first main surface 201 (the surface on which the IC chip 40 is mounted) of the first sealing member 20, six electrode patterns 22 are formed, which include mounting pads for mounting the IC chip 40 as an oscillation circuit element. The IC chip 40 is bonded to the electrode patterns 22 by the flip chip bonding (FCB) method using a metal bump (for example, Au bump) 23 (see FIG. 1).

As shown in FIGS. 2 and 3, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 2 and 3.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective central parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the A2 direction). The connection bonding pattern 261 and the connection bonding pattern 263 are connected to each other via a wiring pattern 27.

Figure 6:
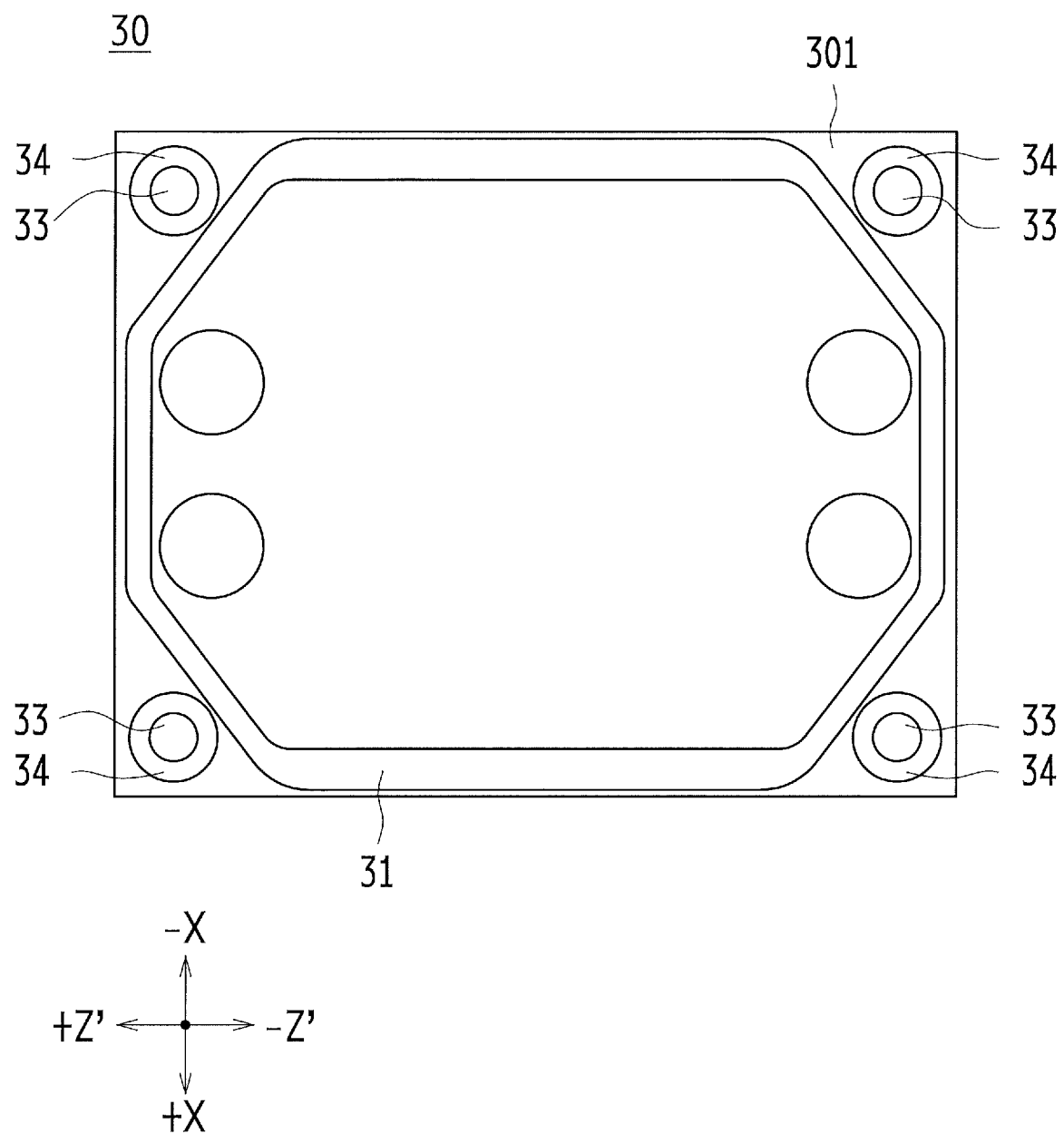
[FIG. 6]
Figure 7:
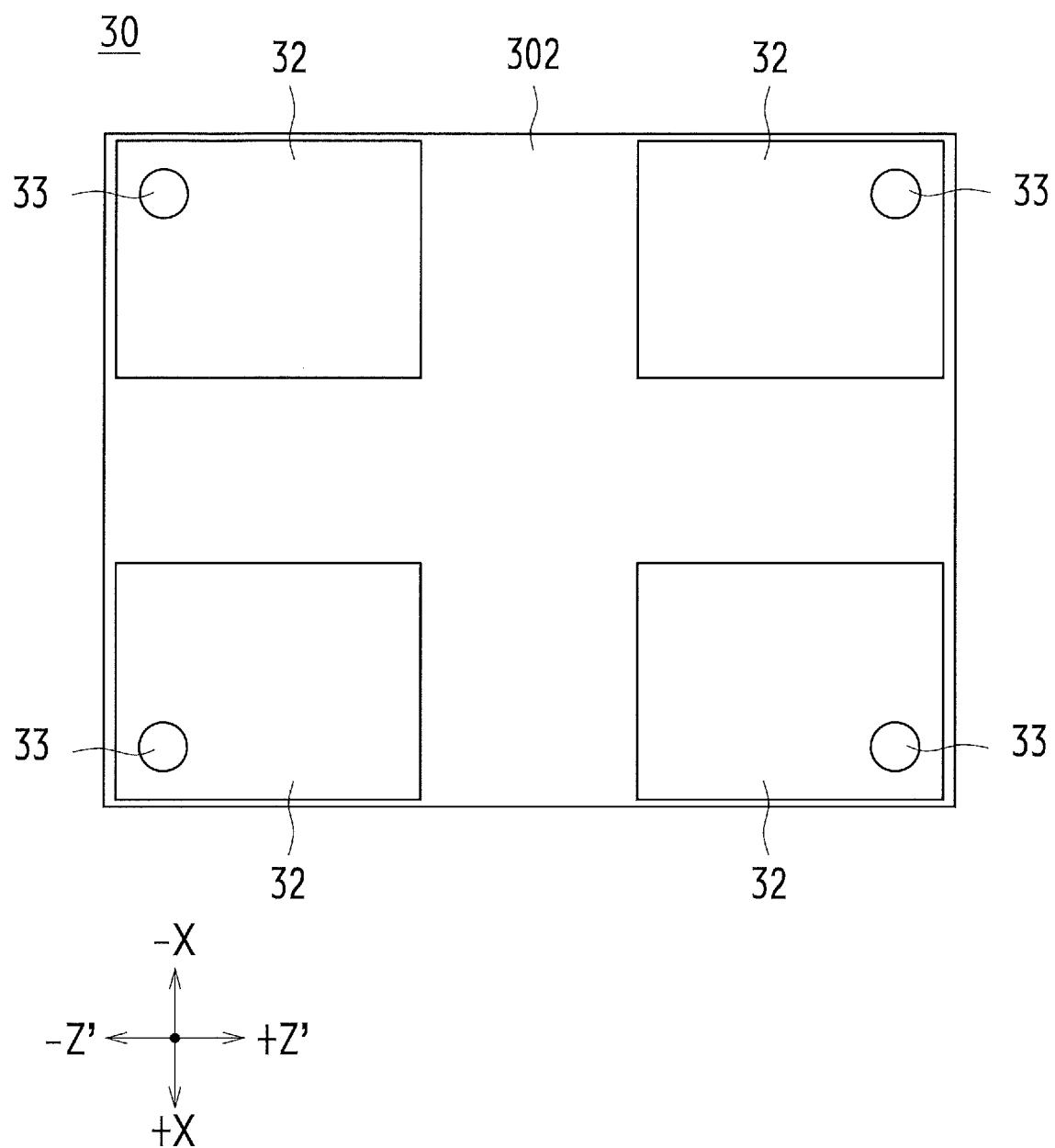
[FIG. 7]

As shown in FIGS. 6 and 7, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

Four external electrode terminals 32, which are electrically connected to the outside, are formed on a second main surface 302 (the outer main surface not facing the crystal resonator plate 10) of the second sealing member 30. The external electrode terminals 32 are respectively located on the four corners (corner parts) of the second sealing member 30.

As shown in FIGS. 6 and 7, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the above through holes so as to establish conduction between the electrodes formed on the first main surface 301 and the second main surface 302. Respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 1 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the IC chip 40 and the external electrode terminals 32 of the crystal oscillator 100.

More specifically, the first excitation electrode 111 is connected to the IC chip 40 via the first lead-out wiring 113, the wiring pattern 27, the fourth through hole 212 and the electrode pattern 22 in this order. The second excitation electrode 112 is connected to the IC chip 40 via the second lead-out wiring 114, the second through hole 162, the fifth through hole 213 and the electrode pattern 22 in this order. Also, the IC chip 40 is connected to the external electrode terminals 32 via the electrode patterns 22, the third through holes 211, the first through holes 161 and the sixth through holes 33 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other pieces of wiring and electrodes formed on the crystal oscillator 100 each preferably have the same configuration as the bonding patterns, which leads to patterning of the bonding patterns, the pieces of wiring and the electrodes at the same time.

The basic configuration of the crystal oscillator 100 according to Embodiment 1 is as described above. However, the characteristic feature of the present invention is the shape of the through hole capable of reducing stress concentration so as to prevent generation of a crack. Hereinafter, this characteristic feature will be described in detail.

Figure 13:
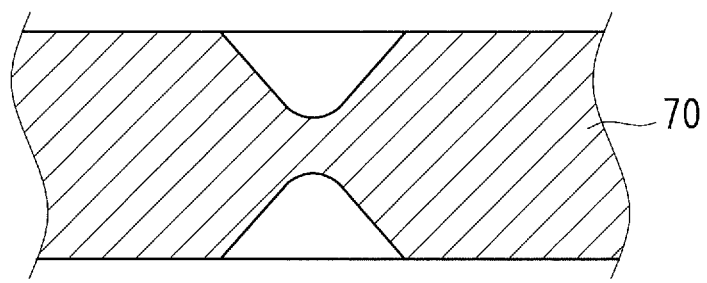
[FIG. 13]
Figure 13:
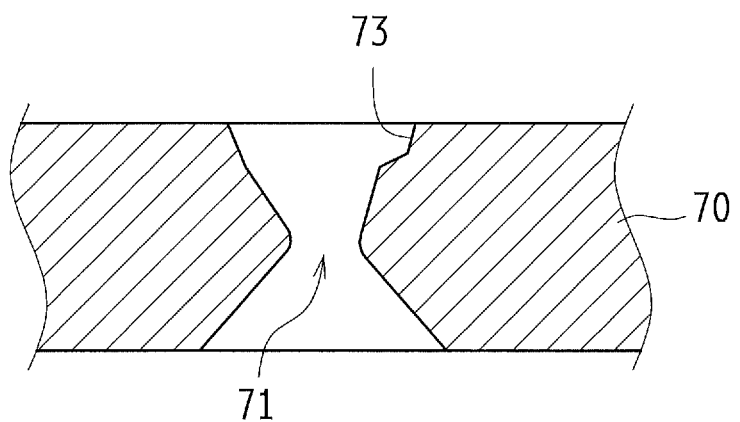

In the manufacturing process of the crystal oscillator 100, after bonding the crystal resonator plate 10, the first sealing member 20 and the second sealing member 30 to each other and obtaining the sandwich-structured package, the IC chip 40 is mounted on approximately the center of the first main surface 201 of the first sealing member 20. As already described above referring to FIG. 13, an external force may be applied to the first sealing member 20 from the above when, for example, mounting the IC chip 40. This external force generates stress in the first sealing member 20, which results in appearance of a crack in the through hole.

The piezoelectric resonator device to which the present invention is applied is not limited to the crystal oscillator as described above. It may be a crystal resonator constituted of only a package made up of a crystal resonator plate, a first sealing member and a second sealing member. That is, in the case of a crystal resonator not having any IC chip, a first sealing member may have wiring for routing and/or shield electrodes on its first main surface (the surface not bonded to the crystal resonator plate), and thus through holes may be formed in the first sealing member in order to establish conduction between the wiring/electrodes. Moreover, even when no IC chip is mounted on the first sealing member, an external force may still be applied to the first sealing member at the time of handling the crystal resonator. Therefore, in the crystal resonator also, the stress may be concentrated to the through hole of the first sealing member, which causes the problem of generation of a crack.

In the above-described crystal oscillator 100, the stress concentration in the through hole especially occurs in the fourth through hole 212. Here, the reason for the above is described.

Normally, a through hole formed in the piezoelectric resonator device has a circular-shape (i.e. having no angle) in plan view, because when the through hole is formed to have a polygonal shape in plan view, any of the angles of the polygon may be a stress concentration point so as to serve as a starting point to generate a crack. The through hole in the piezoelectric resonator device is formed by wet etching, and conventionally, a mask used for etching has a circular-shape.

Figure 8:
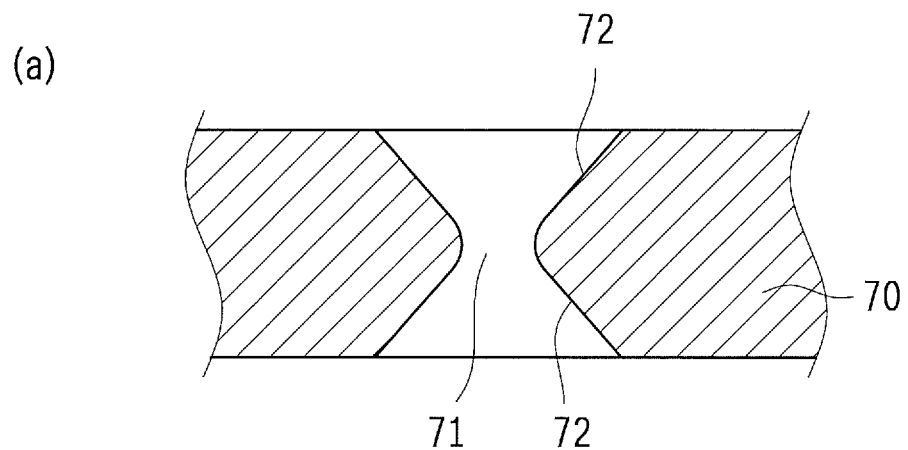
[FIG. 8]
Figure 8:
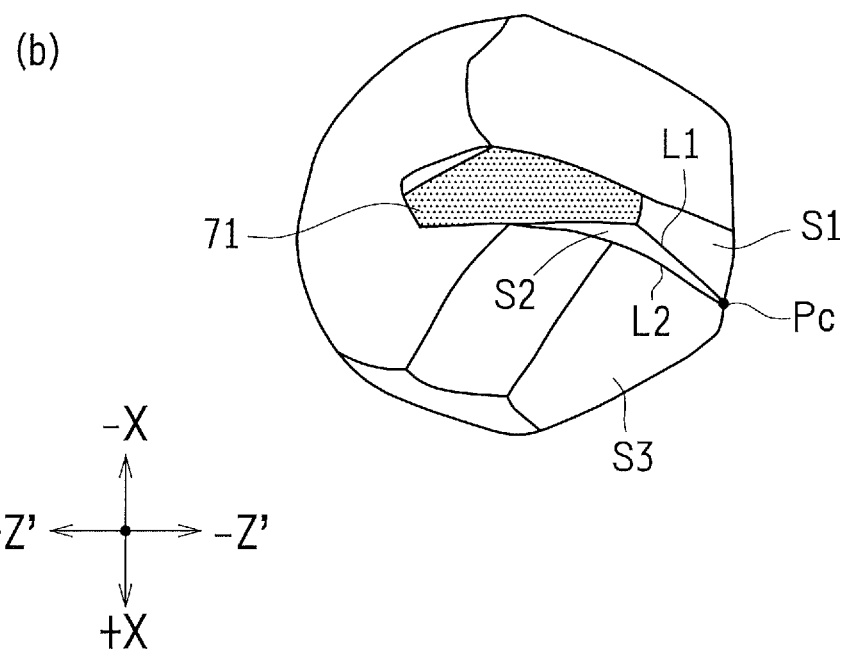

However, when forming a through hole in the crystal plate using a circular mask, a completely circular-shaped through hole cannot be formed due to crystal anisotropy as a property of the crystal. FIG. 8 are diagrams illustrating the shape of a through hole formed in an AT-cut crystal plate 70 by etching using a circular mask. FIG. 8(*a*) is a cross-sectional view thereof. FIG. 8(*b*) is a plan view thereof.

As shown in FIG. 8(*a*), the through hole has a penetrating part 71 in the vicinity of the center part of the AT-cut crystal plate 70, and also has an inclined surface 72 extending from the peripheral area of the through hole toward the penetrating part in the center part of the through hole. Since the through hole is formed by etching from both main surfaces of the AT-cut crystal plate 70, both main surfaces of the AT-cut crystal plate 70 each has the inclined surface 72.

When the through hole is viewed from the direction orthogonal to the main surface of the AT-cut crystal plate 70, the through hole does not have a complete circular shape and the inclined surface 72 is made up of various crystal surfaces, as shown in FIG. 8(*b*). The inclined surface 72 includes: a first crystal surface S1 that extends from the penetrating part 71 toward the peripheral area of the through hole in the −Z' direction and in the +X direction; a second crystal surface S2 that extends from the penetrating part 71 toward the peripheral area of the through hole in the −Z' direction and in the +X direction and that comes into contact with the first crystal surface S1 in the +Z' direction and in the +X direction of the first crystal surface S1; and a third crystal surface S3 that comes into contact with the second crystal surface S2 in the +X direction of the first crystal surface S2 and that comes into contact with the main surface of the AT-cut crystal plate 70 (i.e. comes into contact with the outer peripheral edge of the through hole).

In this through hole, a first ridge line L1 between the first crystal surface S1 and the second crystal surface S2 and a second ridge line L2 between the second crystal surface S2 and the third crystal surface S3 intersect with each other at a point Pc on the outer peripheral edge of the through hole (i.e. the boundary line between the inclined surface 72 and the main surface of the AT-cut crystal plate 70).

In the case in which the third to fifth through holes 211 to 213 are formed each as the through hole illustrated in FIG. 8 in the first sealing member 20 of the crystal oscillator 100 and furthermore an external force is applied to the first sealing member 20 from the above, the stress generated in the first sealing member 20 by the external force acts on the respective through holes. At this time, the point Pc on the through hole is likely to become the stress concentration point so as to serve as the starting point of a crack due to the stress. Among the through holes, the fourth through hole 212 positioned in the +Z' direction relative to the inner peripheral edge of the external frame part 12 of the crystal resonator plate 10 is especially likely to have a crack because, when the point Pc is defined as the point of load in the principle of leverage, the fourth through hole 212 has a distance between the point Pc and the fulcrum (the inner peripheral edge of the external frame part 12 of the crystal resonator plate 10) shorter than those of the other through holes.

Figure 9:
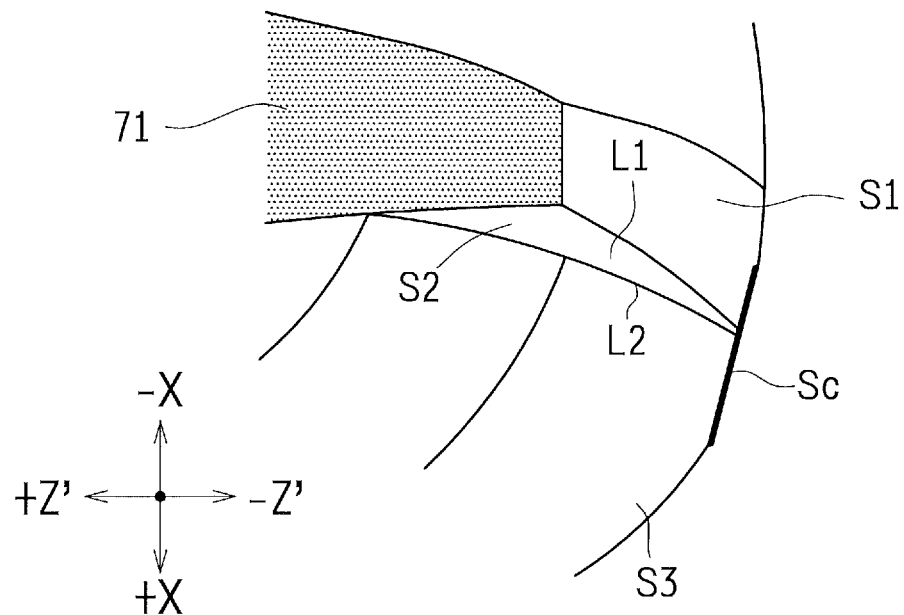
[FIG. 9]
Figure 9:
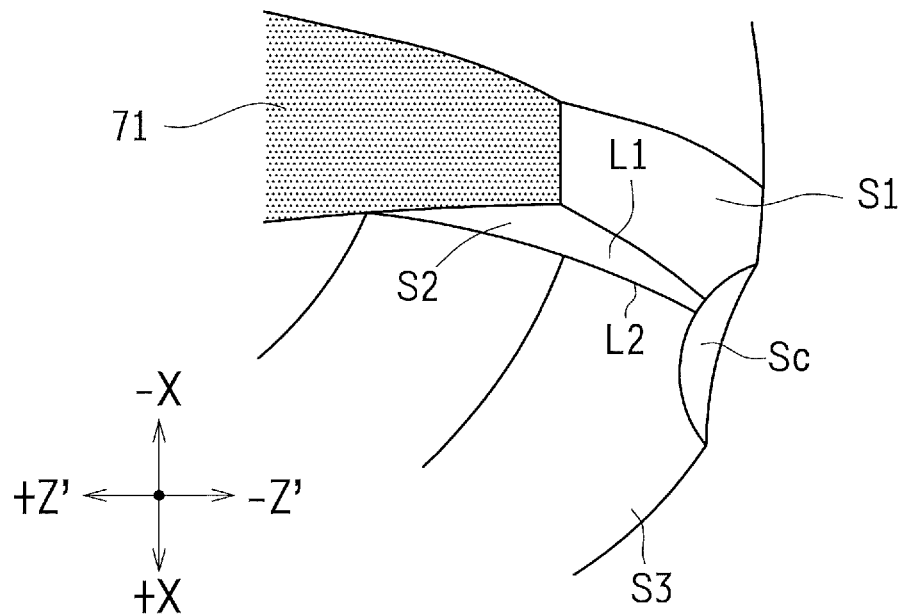

Then, the shape of the through hole according to Embodiment 1 is described referring to FIG. 9, which can prevent generation of the crack. The through hole according to Embodiment 1 has a characteristic feature that a compensation surface Sc is formed on the outer peripheral edge of the through hole (i.e. on the boundary line between the inclined surface 72 and the main surface of the AT-cut crystal plate 70) so as not to generate the point Pc that serves as the stress concentration point. FIG. 9(a) is an enlarged plan view illustrating the vicinity of the compensation surface Sc formed in the through hole. FIG. 9(b) is an enlarged perspective view illustrating the vicinity of the compensation surface Sc formed in the through hole, viewed from diagonally above.

In the through hole according to Embodiment 1 as shown in FIGS. 9(a) and 9(b), the compensation surface Sc is formed so as to come into contact with the outer peripheral edge of the through hole. Also, since the compensation surface Sc is formed in the vicinity of the outer peripheral edge of the through hole in the −Z' direction and in the +X direction, the compensation surface Sc prevents the first ridge line L1 and the second ridge line L2 from reaching the main surface of the AT-cut crystal plate 70.

In the through hole according to Embodiment 1 as described above, since the compensation surface Sc is formed, the first ridge line L1 and the second ridge line L2 do not intersect with each other on the outer peripheral edge of the through hole (i.e. on the boundary line between the inclined surface 72 and the main surface of the AT-cut crystal plate 70). As a result, generation of the point Pc (namely the stress concentration point) as shown in FIG. 8(b) is prevented, which leads to prevention of generation of a crack from the point Pc as the starting point.

Figure 10:
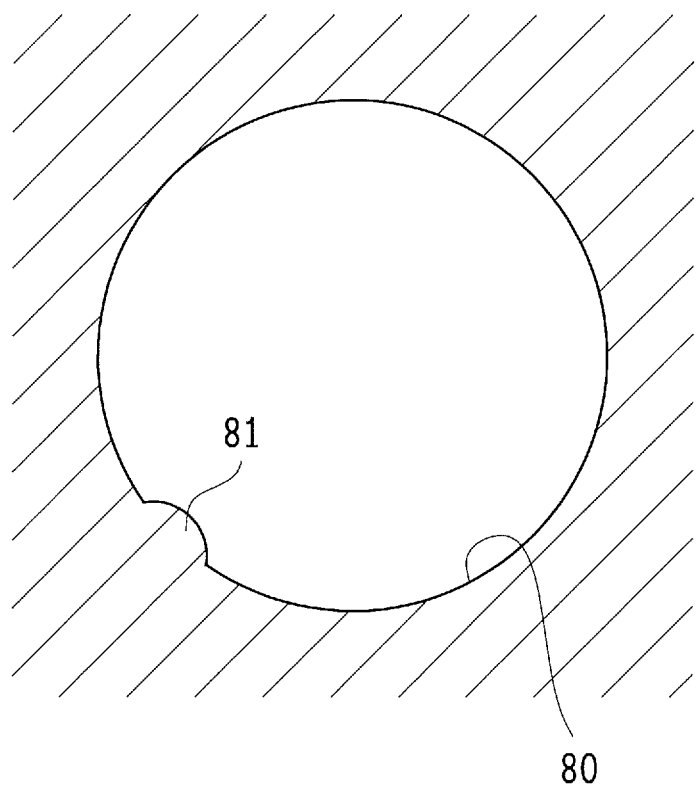
[FIG. 10]

The through hole according to Embodiment 1 can be realized by adjusting the shape of the mask when forming the through hole by etching. As described above, when the circular mask is used, the point Pc as the stress concentration point is generated on the through hole as shown in FIG. 8(b). In contrast, in order to form the through hole according to Embodiment 1, a mask 80 as shown in FIG. 10 is used. The mask 80 includes an overhang part 81 that protrudes in the inner peripheral direction from a part of the circular mask. The overhang part 81 is formed at a position corresponding to the position where the point Pc is generated, i.e. corresponding to the outer peripheral edge of the through hole in the −Z' direction and in the +X direction. When the through hole is formed by etching using the mask 80, the formed through hole has the compensation surface Sc at the position corresponding to the overhang part 81.

The shape and the size of the overhang part 81 of the mask 80 are not particularly limited. More specifically, although the shape and the size of the compensation surface Sc vary according to the shape and the size of the overhang part 81, what is important for the compensation surface Sc is the position where it is formed (i.e. the position that can prevent the first ridge line L1 and the second ridge line L2 from reaching the main surface of the AT-cut crystal plate 70). Therefore, the shape and the size of the compensation surface Sc are not particularly limited.

However, when the compensation surface Sc is too small, the compensation effect is not enough. Thus, it may be difficult to obtain an effect to sufficiently reduce the stress concentration in the through hole. On the other hand, when the compensation surface Sc is too large, the shape of the inclined surface 72 of the through hole becomes complicated due to the compensation surface Sc. Thus, the conduction resistance of the through electrode formed in the through hole may increase. Therefore, it is preferable to form the compensation surface Sc having an appropriate size. In particular, the compensation surface Sc is preferably formed so as to come into contact with only the first to the third crystal surfaces Si to S3 and no to come into contact with the other crystal surfaces, as shown in FIG. 9(b).

Figure 11:
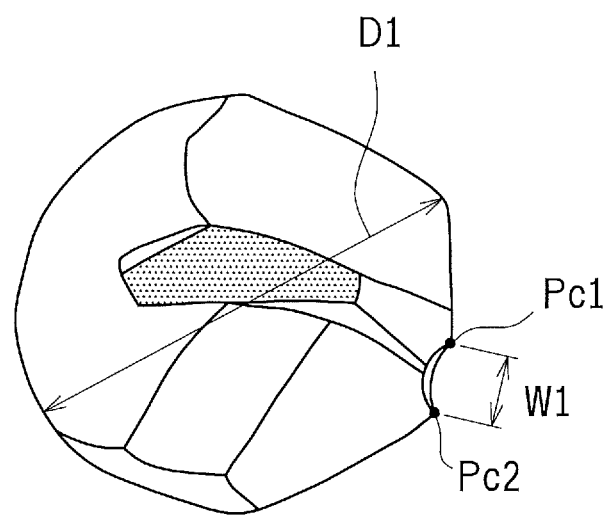
[FIG. 11]

When both endpoints of the boundary line between the compensation surface Sc and the main surface of the AT-cut crystal plate 70 are respectively represented by Pc1 and Pc2 as shown in FIG. 11, the distance W1 between the two points Pc1 and Pc2 is preferably in the range from not less than 5% to not more than 30% of the maximum diameter D1 of the through hole. Here, the maximum diameter D1 of the through hole is the greatest distance out of the distances between any two points that exist on the outer periphery of the through hole.

The through hole according to Embodiment 1 as described above (i.e. the through hole having the compensation surface Sc) is not necessarily applied to all the through holes provided in the piezoelectric resonator device. In the conventional configuration, it is basically sufficient to apply the above type of through hole to a through hole where a crack appears. For example, in the crystal oscillator 100 as shown in FIGS. 1 to 7, it is sufficient to make at least the fourth through hole 212, which is formed in the first sealing member 20 so as to be positioned in the +Z' direction relative to the inner peripheral edge of the external frame part 12 of the crystal resonator plate 10, as the through hole according to Embodiment 1. Furthermore, the part that is likely to have a crack in the fourth through hole 212 is only on the side of the first main surface 201 that is not bonded to the crystal resonator plate 10. On the side of the second main surface 202, which is bonded to the crystal resonator plate 10, the crack is not likely to be generated. Therefore, the compensation surface Sc of the through hole may be formed only on the side of the first main surface 201 of the first sealing member 20.

Embodiment 2

Hereinafter, Embodiment 2 of the present invention will be described in detail with reference to the drawings. The basic configuration of the piezoelectric resonator device according to Embodiment 2 is the same as that of the crystal oscillator 100 as described 15 referring to FIGS. 1 to 7. In Embodiment 2, a shape of the through hole other than that in Embodiment 1 is described, which can also prevent generation of a crack.

Figure 12:
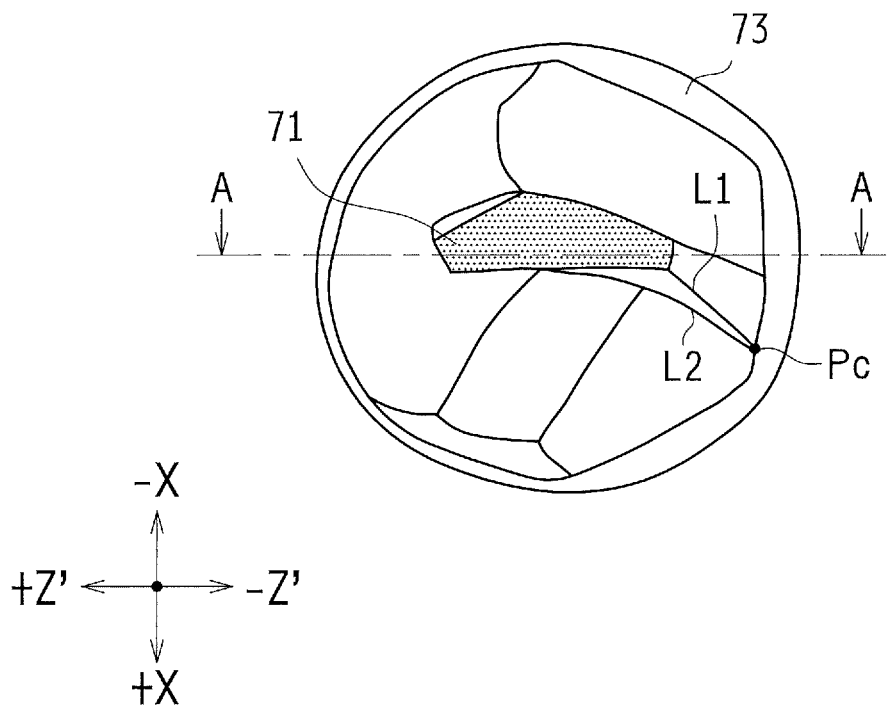
[FIG. 12]
Figure 12:
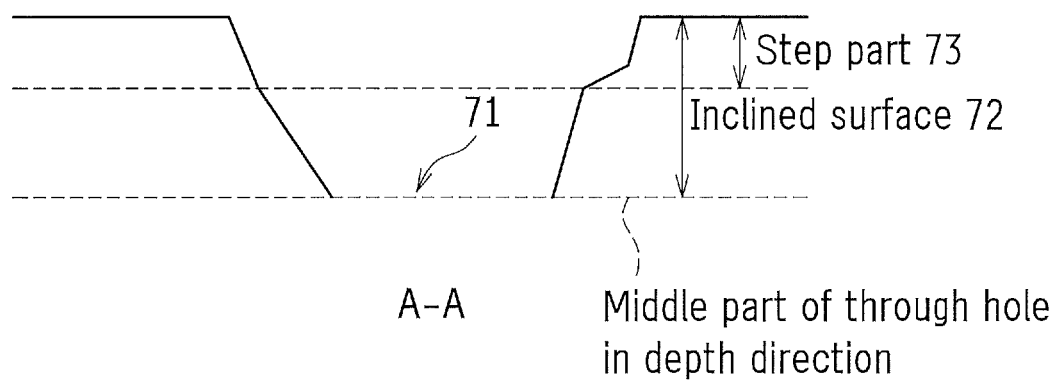

The shape of the through hole according to Embodiment 2 is described referring to FIGS. 12. FIG. 12(a) is a plan view illustrating the through hole according to Embodiment 2. FIG. 12(b) is a cross-sectional view taken from line A-A of FIG. 12(a). FIG. 12(b) shows a cross-section of the through hole, from the middle part thereof in the depth direction to one main surface.

The through hole according to Embodiment 2 includes, as shown in FIGS. 12(a) and 12(b), a step part 73 formed on the outer periphery of the through hole so as not to generate the point Pc as the stress concentration point on the outer peripheral edge of the through hole. That is, in the through hole according to Embodiment 2, the inclined surface 72 is formed so as to surround the penetrating part 71, and furthermore the step part 73 is formed on the outer periphery of the inclined surface 72.

In the through hole according to Embodiment 2, since the step part 73 is formed on the outer periphery of the through hole, the point Pc at which the first ridge line L1 intersects with the second ridge line L2 does not position on the outer peripheral edge of the through hole (i.e. on the boundary line between the step part 73 and the main surface of the AT-cut crystal plate 70). In other words, when the step part 73 is formed, the intersection of the first ridge line L1 and the second ridge line L2 is blocked by the step part 73, which prevents the intersection from reaching the main surface of the AT-cut crystal plate 70. Consequently, it is possible to prevent generation of the stress concentration point on the outer peripheral edge of the through hole, which also prevents generation of a crack from the stress concentration point as the starting point.

The through hole according to Embodiment 2 is realized by etching in two steps when the through hole is formed by etching. Specifically, in the first etching step, the AT-cut crystal plate 70 is etched from both main surfaces just before the penetrating part 71 is formed, as shown in FIG. 13(a). Then, in the second etching step, it is preferable to penetrate the AT-cut crystal plate 70 and form the penetrating part 71 while forming the step part 73 as shown in FIG. 13(b).

In this case, circular masks having the same size are respectively used on both main surfaces in the first etching step. Then, in the second etching step, the mask is replaced, on the main surface where the step part 73 is to be formed, with a mask having a larger size. That is, after removing the circular mask used in the first etching step from the AT-cut crystal plate 70, the new mask is formed. As it is described in detail later, in the through hole according to Embodiment 2, basically, it is not necessary to form the step part 73 on each of the main surfaces of the AT-cut crystal plate 70. Thus, in the cross-section shown in FIG. 13(b), the step part 73 is formed only on the side of the upper main surface. On the side of the lower main surface, the step part 73 is not formed. On the main surface in which the step part 73 is not formed, it is not necessary to change the mask in the first etching step to the mask in the second etching step.

In the second etching step for forming the step part 73, the shape of the mask that is used may have a circular shape or may have a shape other than the circle. When using the circular mask in the second etching step, the mask has a size (diameter) larger than the circular mask used in the first etching step. Also, the mask in the second etching step may be concentrically positioned with respect to the mask in the first etching step. Alternatively, it may be eccentrically positioned with respect to the mask in the first etching step. More specifically, the mask in the second etching step may be eccentrically positioned in the −Z' direction and/or the +X direction with respect to the mask in the first etching step such that the step part 73 is reliably formed at a position corresponding to the position where the above-described point Pc is generated.

Figure 14:
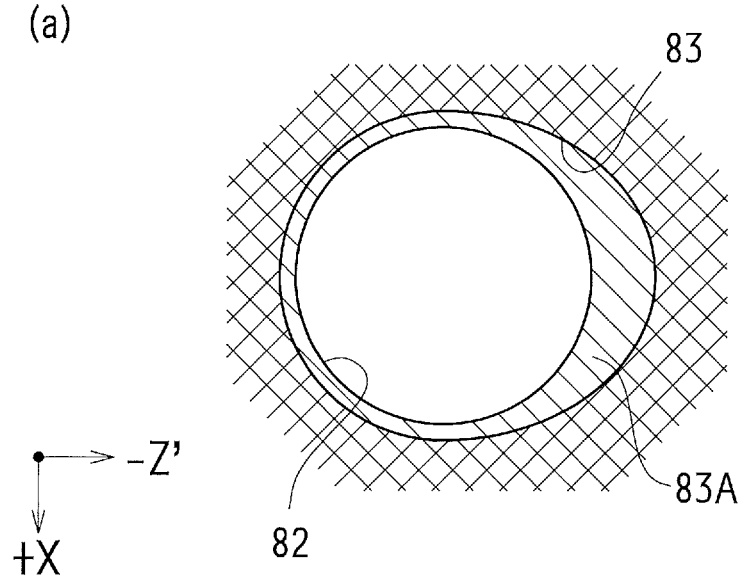
[FIG. 14]
Figure 14:
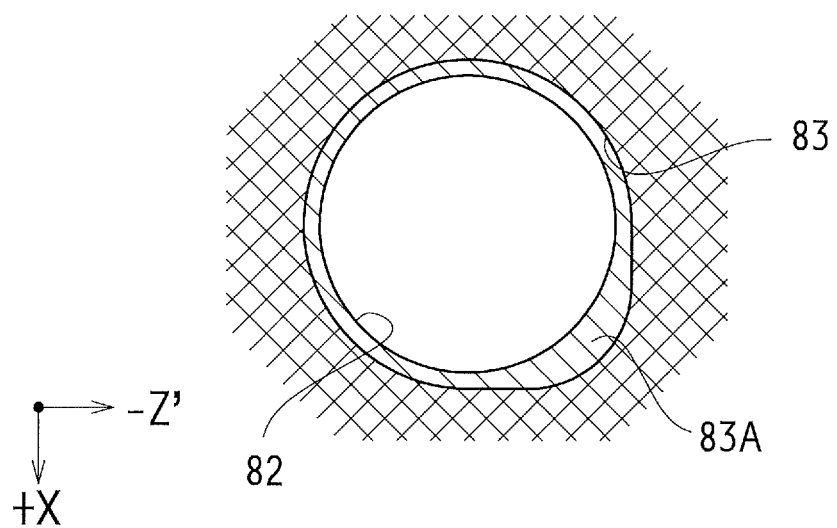
Figure 15:
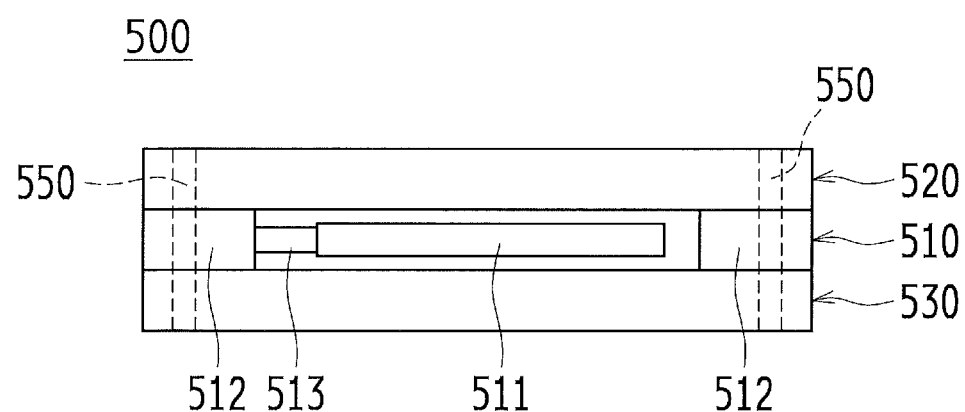
[FIG. 15]
Figure 16:
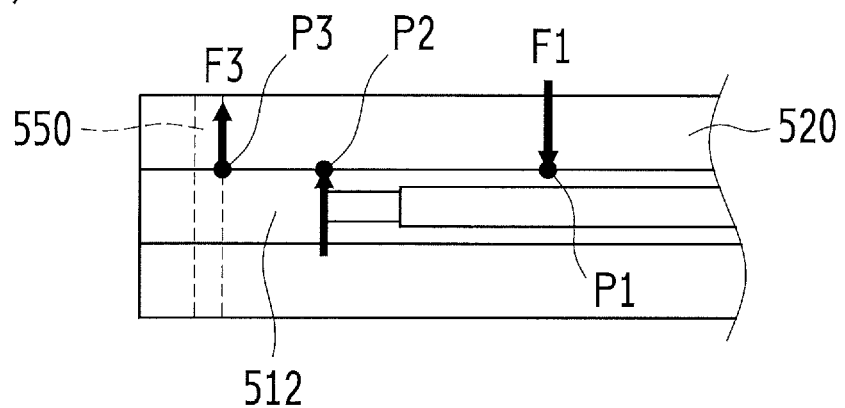
[FIG. 16]
Figure 16:
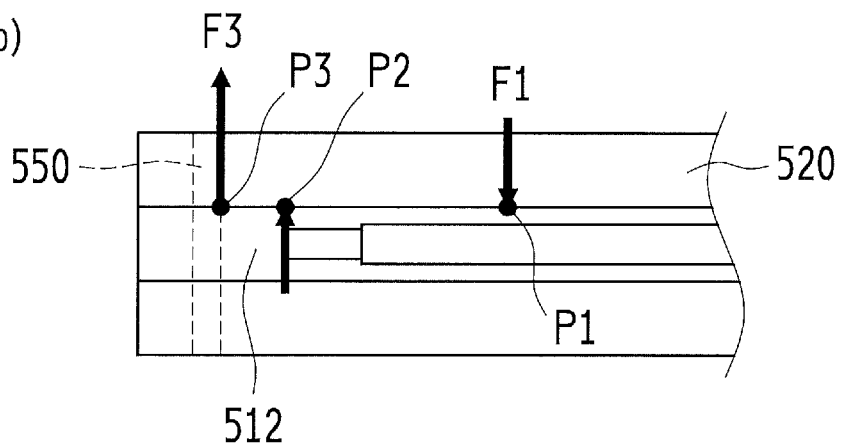

Also, when using the mask having a shape other than the circle in the second etching step, it is preferable that the shape is designed in order to reliably form the step part 73 at a position corresponding to the position where the point Pc is generated. For example, as shown in FIGS. 14(a) and 14(b), it is considered that a mask 83 used in the second etching step has an extended part 83A made by extending the outer peripheral edge of the circle in the −Z' direction and/or the +X direction with respect to the circular mask 82 used in the first etching step.

Here, the shape and the size of the extended part 83A of the mask 83 are not particularly limited. More specifically, although the shape and the size of the step part 73 vary in association with the change in the shape and the size of the extended part 83A, what is important for the step part 73 is to prevent the point Pc from being formed on the outer peripheral edge of the through hole. Therefore, the shape and the size of the extended part 83A are not particularly limited. Furthermore, it is not necessary to form the step part 73 over the whole periphery of the through hole. The step part 73 may be formed at least in the region from the penetrating part 71 toward the area in the −Z' direction and in the +X direction.

However, when the step part 73 in the vicinity of the position where the point Pc is generated is too small, the point Pc as the stress concentration point may be generated near the outer peripheral edge of the through hole, which may result in an insufficient effect to reduce the stress concentration in the through hole. On the other hand, when the step part 73 is too large, a new stress concentration point may be generated on the outer peripheral edge of the step part 73 (i.e. on the boundary line between the step part 73 and the main surface of the AT-cut crystal plate 70), which may serve as a starting point to generate a crack. Therefore, it is preferable to form the step part 73 having an appropriate size. In this respect, it is preferable that, for example, the depth of the step part 73 (i.e. the size of the step part 73 in the depth direction of the through hole) is in the range from not less than 5 μm to not more than 20 μm. Alternatively, it is preferable that the maximum distance between the inner peripheral edge and the outer peripheral edge of the step part 73 (i.e. the distance in the vicinity of the position where the point Pc is generated) is in the range from not less than 5 μm to not more than 20 μm.

The through hole according to Embodiment 2 as described above (i.e. the through hole having the step part 73) is not necessarily applied to all the through holes provided in the piezoelectric resonator device. In the conventional configuration, it is basically sufficient to apply the above type of through hole to a through hole where a crack appears. For example, in the crystal oscillator 100 as shown in FIGS. 1 to 7, it is sufficient to make at least the fourth through hole 212, which is formed in the first sealing member 20 so as to be positioned in the +Z' direction relative to the inner peripheral edge of the external frame part 12 of the crystal resonator plate 10, as the through hole according to Embodiment 2. Furthermore, the part that is likely to have a crack in the fourth through hole 212 is only on the side of the first main surface 201 that is not bonded to the crystal resonator plate 10. On the side of the second main surface 202, which is bonded to the crystal resonator plate 10, the crack is not likely to be generated. Therefore, the step part 73 of the through hole may be formed only on the side of the first main surface 201 of the first sealing member 20.

The above-disclosed embodiments are to be considered in all respects as illustrative and not limiting. The technical scope of the invention is indicated by the appended claims rather than by the foregoing embodiments, and all modifications and changes that come within the meaning and range of equivalency of the claims are intended to be embraced therein.

DESCRIPTION OF REFERENCE NUMERALS

100 Crystal oscillator (piezoelectric resonator device)
10 Crystal resonator plate (piezoelectric resonator plate)
11 Vibrating part
111 First excitation electrode
112 Second excitation electrode
12 External frame part
13 Support part
20 First sealing member
201 First main surface (of first sealing member)
202 Second main surface (of first sealing member)
211 Third through hole (through hole of first sealing member)
212 Fourth through hole (through hole of first sealing member)
213 Fifth through hole (through hole of first sealing member)
30 Second sealing member
40 IC chip
70 AT-cut crystal plate
71 Penetrating part
72 Inclined surface
73 Step part
80 Mask
81 Overhang part
82 Mask used in first etching step
83 Mask used in second etching step
83A Extended part
S1 First crystal surface
S2 Second crystal surface
S3 Third crystal surface
L1 First ridge line
L2 Second ridge line

The invention claimed is:

1. A piezoelectric resonator device, comprising:
a piezoelectric resonator plate;
a first sealing member covering a first main surface of the piezoelectric resonator plate;
a second sealing member covering a second main surface of the piezoelectric resonator plate; and
an internal space formed by bonding the first sealing member to the piezoelectric resonator plate and by bonding the second sealing member to the piezoelectric resonator plate, the internal space hermetically sealing a vibrating part including a first excitation electrode and a second excitation electrode of the piezoelectric resonator plate, wherein
the piezoelectric resonator plate includes: the vibrating part; a support part that supports the vibrating part; and an external frame part that surrounds an outer periphery of the vibrating part and that supports the support part,
the first sealing member is made of an AT-cut crystal plate,
the first sealing member includes a through hole that is provided in a +Z' direction relative to an inner peripheral edge of the external frame part of the piezoelectric resonator plate,
the through hole includes an inclined surface in a main surface, which is opposite to a surface bonded to the piezoelectric resonator plate, of the first sealing member, and the inclined surface extends from a peripheral area of the through hole toward a penetrating part in a center part of the through hole,
the inclined surface includes three crystal surfaces: a first crystal surface that extends from the penetrating part toward the peripheral area of the through hole in a −Z' direction and in a +X direction; a second crystal surface that extends from the penetrating part toward the peripheral area of the through hole in the −Z' direction and in the +X direction and that comes into contact with the first crystal surface in the +Z' direction and in the +X direction of the first crystal surface; and a third crystal surface that comes into contact with the second crystal surface in the +X direction of the second crystal surface and that comes into contact with the main surface of the first sealing member, and
a compensation surface is formed between the main surface of the first sealing member and the three crystal surfaces so as to prevent a ridge line between the first crystal surface and the second crystal surface and also a ridge line between the second crystal surface and the third crystal surface from reaching the main surface of the first sealing member.

2. The piezoelectric resonator device according to claim 1, wherein
the compensation surface comes into contact with only the three crystal surfaces in the inclined surface and does not come into contact with any other crystal surfaces.

3. The piezoelectric resonator device according to claim 1, wherein
in a boundary line between the compensation surface and the main surface of the first sealing member, a distance between both endpoints of the boundary line is in a range from not less than 5% to not more than 30% of a maximum diameter of the through hole.

4. A piezoelectric resonator device, comprising:
a piezoelectric resonator plate;
a first sealing member covering a first main surface of the piezoelectric resonator plate;
a second sealing member covering a second main surface of the piezoelectric resonator plate; and
an internal space formed by bonding the first sealing member to the piezoelectric resonator plate and by bonding the second sealing member to the piezoelectric resonator plate, the internal space hermetically sealing a vibrating part including a first excitation electrode and a second excitation electrode of the piezoelectric resonator plate, wherein the piezoelectric resonator plate includes: the vibrating part; a support part that supports the vibrating part; and an external frame part that surrounds an outer periphery of the vibrating part and that supports the support part, the first sealing member is made of an AT-cut crystal plate, the first sealing member includes a through hole that is provided in a +Z' direction relative to an inner peripheral edge of the external frame part of the piezoelectric resonator plate, the through hole includes an inclined surface in a main surface, which is opposite to a surface bonded to the piezoelectric resonator plate, of the first sealing member, and the inclined surface extends from a peripheral area of the through hole toward a penetrating part in a center part of the through hole, and in ridge lines between crystal surfaces that exist in the inclined surface, no ridge line intersects with any other ridge line on an outer periphery of the through hole.

* * * * *